United States Patent
Viala et al.

(10) Patent No.: US 10,181,807 B2
(45) Date of Patent: Jan. 15, 2019

(54) CONVERTER FOR CONVERTING A VARIATION IN ENERGY TO BE RECOVERED INTO A POTENTIAL DIFFERENCE

(71) Applicants: COMMISSARIAT A L'ENERGIE A ATOMIQUE ET AUX ENERGIES ALTERNATIVES, Paris (FR); INSTITUT POLYTECHNIQUE DE GRENOBLE, Grenoble (FR)

(72) Inventors: Bernard Viala, Sassenage (FR); Jerome Delamare, Grenoble (FR)

(73) Assignees: COMMISSARIAT À L'ÉNERGIE ATOMIQUE ET AUX ÉNERGIES ALTERNATIVES, Paris (FR); INSTITUT POLYTECHNIQUE DE GRENOBLE, Grenoble (FR)

( * ) Notice: Subject to any disclaimer, the term of this patent is extended or adjusted under 35 U.S.C. 154(b) by 285 days.

(21) Appl. No.: 15/031,986

(22) PCT Filed: Oct. 23, 2014

(86) PCT No.: PCT/FR2014/052706
§ 371 (c)(1),
(2) Date: Apr. 25, 2016

(87) PCT Pub. No.: WO2015/059421
PCT Pub. Date: Apr. 30, 2015

(65) Prior Publication Data
US 2016/0276958 A1 Sep. 22, 2016

(30) Foreign Application Priority Data
Oct. 25, 2013 (FR) ...................... 13 60428

(51) Int. Cl.
*H02N 2/18* (2006.01)
*H01L 41/00* (2013.01)
*H01L 41/12* (2006.01)

(52) U.S. Cl.
CPC ............... *H02N 2/18* (2013.01); *H01L 41/00* (2013.01); *H01L 41/125* (2013.01)

(58) Field of Classification Search
CPC ............... H01L 41/113; H01L 41/1132; H01L 41/1134; H01L 41/1136; H01L 41/1138; H02N 2/18
(Continued)

(56) References Cited

U.S. PATENT DOCUMENTS 5,739,601 A    4/1998  Tsodikov
9,887,346 B2 * 2/2018  White ................... H01L 41/113
(Continued)

FOREIGN PATENT DOCUMENTS

WO    2007/063194 A1    6/2007

OTHER PUBLICATIONS

Thomas Lafont, et al., "Magnetostrictive-piezoelectric Composite Structures for Energy Harvesting," Journal of Micromechanics & Microengineering, Institute of Physics Publishing, vol. 22, No. 9, XP020228735, Aug. 24, 2012, (6 pages).
(Continued)

*Primary Examiner* — Derek Rosenau
(74) *Attorney, Agent, or Firm* — Oblon, McClelland, Maier & Neustadt, L.L.P.

(57) ABSTRACT

A converter including a first transducer that can lengthen inside at least a first deformation zone and simultaneously shrink inside at least a different second deformation zone. Inner faces of second and third electromechanical transducers are secured respectively, with no degree of freedom, substantially to the first and second deformation zones of the
(Continued)

layer of the first transducer. The third transducer differs from the second transducer by the polarization of its layer of piezoelectric material in a different direction to polarization of the layer of piezoelectric material of the second transducer and/or by existence of a separation that mechanically and electrically insulates a first electrode of the third transducer from a first electrode of the second transducer located on a same side of the layer of piezoelectric material.

16 Claims, 4 Drawing Sheets

(58) Field of Classification Search
  USPC .......................................................... 310/339
  See application file for complete search history.

(56) References Cited

U.S. PATENT DOCUMENTS

| 2004/0126620 | A1 | 7/2004 | Viehland et al. | |
|---|---|---|---|---|
| 2005/0280334 | A1* | 12/2005 | Ott | H01L 41/1136 |
| | | | | 310/339 |
| 2012/0068576 | A1* | 3/2012 | Lee | H01L 41/1136 |
| | | | | 310/339 |

OTHER PUBLICATIONS

Xianzhi Dai, et al., "Energy harvesting from mechanical vibrations using multiple magnetostrictive/piezoelectric composite transducers," Sensors and Actuators, vol. 166, No. 1, XP028142137, Dec. 31, 2010, pp. 94-101.

Yu Xin-Jie, et al., "Wireless energy transfer system based on metglas/PFC magnetoelectric laminated composites," Acta Phys. Sin., vol. 62, No. 5, XP055122798, Mar. 5, 2013, p. 058503-1.

Sunghwan Kim, et al., "Piezoelectric Energy Harvesting Using a Clamped Circular Plate: Experimental Study," Aerospace Division, American Society of Mechanical Engineers, vol. 68, XP009178481, Jan. 1, 2003, pp. 461-469.

Dmitry Zakharov, et al., "Thermal energy conversion by coupled shape memory and piezoelectric effects," Journal of Micromechanics and Microengineering, 2012, (8 pages).

G. A. Lebedev, et al., "Thermal Energy Harvesting Using Shape Memory/Piezoelectric Composites," Transducers'11, Jun. 5-9, 2011, (2 pages).

International Search Report dated Mar. 6, 2015 in PCT/FR2014/052706 filed Oct. 23, 2014.

* cited by examiner

CONVERTER FOR CONVERTING A VARIATION IN ENERGY TO BE RECOVERED INTO A POTENTIAL DIFFERENCE

The invention relates to a converter of a variation in energy to be harvested into a potential difference and to a generator of electricity incorporating this converter.

Here, by potential difference, what is meant is a voltage between two electrical terminals, one of these electrical terminals comprising an excess of electrical charges relative to the other of these terminals.

Such known converters include:
a first transducer including a layer extending essentially in a plane, called a reference plane, and behaving mechanically as a single block of material, this layer being able to lengthen in the interior of at least one first zone of deformation of the reference plane and, simultaneously, to shrink in the interior of at least one second zone of deformation of the reference plane in response to a given variation in energy to be harvested, the second zone being distinct from the first zone; and
electromechanical second and third transducers, each electromechanical transducer including:
a layer made of piezoelectric material extending essentially parallelly to the reference plane and having exterior and interior faces extending parallelly to this plane, the interior face being fixed with no degree of freedom to the layer of the first transducer in order to undergo a mechanical stress exerted by one of the zones of this layer; and
first and second electrodes made of electrically conductive material extending essentially parallelly to the reference plane along at least one of the faces of the layer made of piezoelectric material of the second transducer in order to cause an excess of electrical charges to appear on one of these electrodes in response to the mechanical stress undergone by the layer made of piezoelectric material.

Such converters are for example described in patent application US2004126620A1. The operating mode of this type of converter is also presented in the following articles:

Article A1: T. Lafont, J. Delamare, G. A. Lebedev, D. I. Zakharov, B. Viala, O. Cugat, L. Gimeno, N. Galopin, L. Garbuio and O. Geoffroy, "*Magnetostrictive-piezoelectric composite structures for energy harvesting*", Journal of michromechanics and microengineering, n°22, 2012;

Article A2: D. Zakharov, G. Lebedev, O. Cugat, J. Delamare, B. Viala, T. Lafont, L. Gimeno and A. Shelyakov, "*Thermal energy conversion by coupled shape memory and piezoelectric effects*", PowerMEMS '11, Seoul, Korea, J M M 2012; and Article A3: G. A. LEBEDEV et al., "*Thermal energy harvesting using shape memory/piezoelectric composites*", Transducer '11, Beijing, China, Jun. 5-9, 2011.

Prior art is also known from:
Xianshi Dai et al.: "Energy harvesting from mechanical vibrations using multiple magnetostrictive/piezoelectric composite transducers", Sensors and Actuators A, Elsevier Sequoia S. A. Lausanne, C H, vol. 166, n°1, Dec. 31, 2010, 94-101;

Xin-Jie Yu et al.: "Wireless energy transfer system based on metglas/PFC magnetoelectric laminated composites", 2013 May 3, 058503-1;

Kim S et al.: "Piezoelectric energy harvesting using a clamped circular plate: Experimental study", AD/Aerospace Division, American Society of mechanical engineers, vol. 68, 2003 Jan. 1, pages 461-469.

The invention aims to increase the efficacy of this type of converter. Efficacy is defined here as being the amount of electrical energy produced for a given variation in the energy to be harvested.

The subject of the invention is therefore such a converter according to claim 1.

By "polarization of the layer made of piezoelectric material" what is meant is the polarization of this layer that was created during its manufacture and that exists even in the absence of application of a mechanical stress to this layer. Because of this, this polarization is also called "pre-polarization". It especially determines on which electrode of the electromechanical transducer will appear an excess of electrical charges in response to a tensile stress applied to the layer made of piezoelectric material.

In known converters, the electromechanical transducer typically comprises:
a layer made of piezoelectric material that extends both over the first and second zones of deformation; and
a single electrode that covers the entire exterior face of the layer made of piezoelectric material.

Thus, in known converters, the layer made of piezoelectric material generates, above first zones of deformation, electrical charges of a first sign and simultaneously, above second zones of deformation, electrical charges of a second opposite sign. In known converters, the same electrode covers the entire exterior face of the piezoelectric layer. Thus, the electrical charges generated above the second zones cancel out charges generated above the first zones. This decreases proportionally the potential difference generated by known converters in response to a variation in the energy to be harvested and therefore the efficacy of such converters.

The Applicants have discovered this effect and have exploited it to, in contrast, increase the efficacy of the converter. Thus, the claimed converter includes not one but at least two distinct electromechanical transducers. These electromechanical transducers are placed relative to the first transducer in order to exploit separately its first and second zones of deformation. Therefore, the electrical charges generated by the third transducer are no longer subtracted from the charges generated by the second transducer. This makes it possible to increase the efficacy of the converter. In addition, it is possible to electrically interconnect the electrodes of the electromechanical transducers so as to increase the energy harvested, and thus further increase the efficacy of the converter.

Embodiments of this converter may include one or more of the features of the dependent claims.

These embodiments of the converter furthermore have the following advantages:
using electromechanical transducers the layers made of piezoelectric material of which have opposite polarization directions, said transducers being placed on the same face of the first transducer, allows the electrical connection of this converter to be simplified because all the charges generated on a given side of the converter are of the same sign;
using a common electrode for the electromechanical first and second transducers allows the manufacture of the converter to be simplified;
stacking a fourth transducer similar to the first transducer on the exterior face of the layers made of piezoelectric material of the second and third transducers allows the efficacy of the converter to be increased;

producing thin partitions between the various layers of piezoelectric material, i.e. partitions the thickness of which is essentially smaller than the thickness of the layer made of piezoelectric material, allows the efficacy of the converter to be increased especially when the latter is very small in size;

employing second and third transducers that together cover almost the entirety of the surface of the first and second zones of deformation allows the efficacy of the converter to be increased;

placing specimens of the second and third transducers symmetrically relative to a median plane of the first transducer allows the deflection of the converter in directions perpendicular to this plane of symmetry to be limited;

using a disk-shaped first transducer makes it possible to produce electrical energy efficiently from a rotary movement of a permanent magnet relative to the converter.

Another subject of the invention is a generator of electricity including the above converter.

Embodiments of this generator may include one or more of the features of the dependent claims.

The arrangement of the permanent magnets so that their orthogonal projections in the reference plane are orthogonal increases the efficacy of the converter. Specifically, this makes it possible to increase the shrinkage in the interior of the second zone of deformation relative to the case where the second permanent magnet is absent.

The invention will be better understood on reading the following description which is given merely by way of nonlimiting example and with reference to the drawings, in which.

Figure 1:
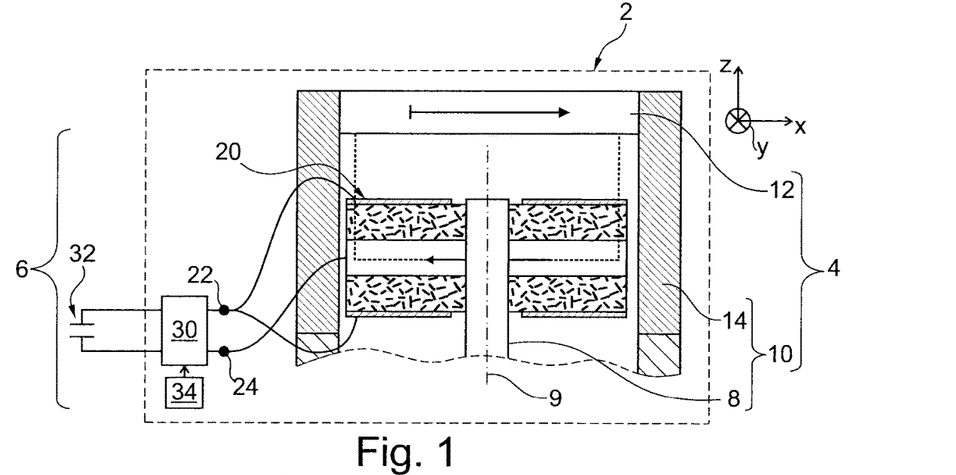
FIG. 1 is a schematic illustration, partially in vertical cross section, of a generator of electricity using an energy harvester for this.

FIG. 1 shows a generator 2 of electricity. This generator 2 includes:
a source 4 of energy to be harvested; and
an energy harvester 6 suitable for converting a variation in the energy to be harvested into electricity.

Here, the generator 2 is described in the particular case where the energy to be harvested is a variable magnetic field.

More precisely, in this embodiment, the variable magnetic field is a rotating magnetic field the magnetic moment of which giving rise thereto turns about itself. To this end, the source 4 comprises:
an apparatus 10 equipped with a shaft 8 driven to rotate about itself about a vertical axis 9; and
a permanent magnet 12 fixed with no degree of freedom to a stationary mounting 14 of this apparatus 10 in proximity to the distal end of the shaft 8.

In FIG. 1 and the following figures, the vertical direction is identified by a Z direction of an orthogonal XYZ coordinate system. The X and Y directions of this XYZ coordinate system are therefore horizontal. In the following, the terms "above", "below", "lower" and "upper", "top" and "bottom", "up and down" and "underneath" are defined relative to the Z direction.

For example, the apparatus 10 is a liquid or gas meter and the shaft 8 is the shaft of this apparatus 10 driven to rotate by the liquid or the gas consumed. To simplify the figure, only one portion of the apparatus 10 has been shown.

The permanent magnet 12 is a uniaxial permanent magnet having a magnetic moment parallel to the X direction. A uniaxial permanent magnet is a permanent magnet that has a single magnetic moment in a single direction.

The harvester 6 includes a converter 20 that converts the variable magnetic field into a corresponding excess of electrical charges on a connection terminal 22 or 24. The excess is here measured relative to the other of the terminals 22 or 24. This converter 20 is fixed with no degree of freedom to the distal end of the shaft 8. Thus, in this embodiment, the rotating magnetic field is obtained by making the converter 20 and not the magnet 12 turn about itself. The converter 20 is electrically connected to the terminals 22, 24 by way of a conventional device for electrical connection of a rotating part to fixed electrical terminals.

The harvester 6 also includes:
a circuit 30 for collecting the excess of electrical charges on the terminal 22 or 24 and for transferring these collected electrical charges to a piece of electrical equipment 32; and
a circuit 34 for controlling the circuit 30.

For example, the piece of equipment 32 is a capacitor that stores the harvested energy. The collecting circuit 30 and the controlling circuit 34 are for example identical to those described in patent application WO 2007/063194 and, preferably, identical to one of those described in the patent application filed under the number FR 1260047, on 22 Oct. 2012 by the Commissariat à l'énergie atomique et aux énergies alternatives. Therefore, these circuits 30 and 34 are not described here in more detail.

Figure 2A:
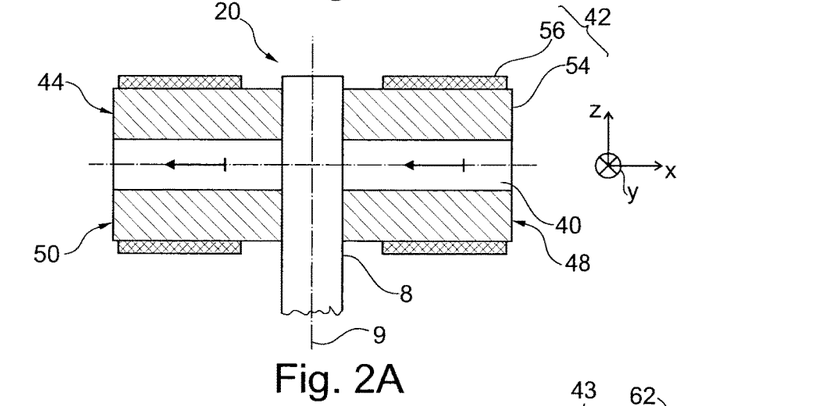
FIG. 2A is a schematic illustration, in vertical cross section, of a first embodiment of an energy converter used in the energy harvester in FIG. 1.
Figure 2B:
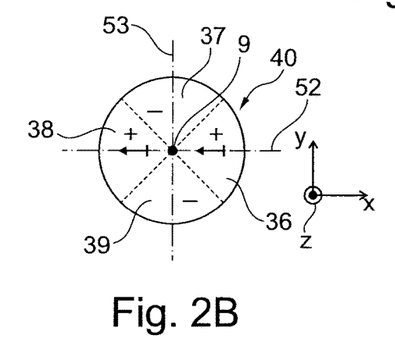
FIG. 2B is a schematic illustration of a top view of a layer made of magnetostrictive material, which layer is used in the converter in FIG. 2A.
Figure 3:
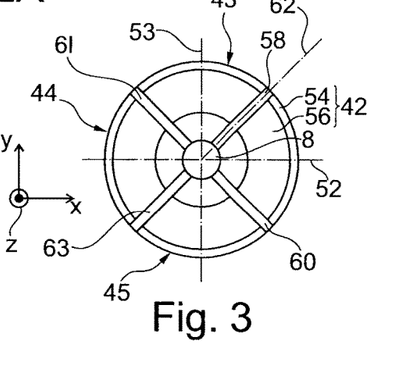
FIG. 3 is a schematic illustration of a top view of the converter in FIG. 2A.

FIGS. 2A, 2B and 3 show the converter 20 in more detail.

The converter 20 is capable of converting into electricity very slow variations in the energy to be harvested. By "slow variation", what is meant is variations the fundamental frequency of which is lower than 10 Hz. To this end, the converter 20 converts a variation in the amplitude of the variable magnetic field in a given direction into a generation of an excess of charges on the terminal 22 and, in alternation, on the terminal 24. This conversion takes place almost instantaneously so that the voltage between the terminals 22 and 24 varies as and at the same time as the amplitude of the variable magnetic field varies in a given direction.

The converter 20 includes a magnetic transducer associated with electromechanical transducers. The magnetic transducer is a layer 40 of magnetostrictive material. The layer 40 is produced from a magnetostrictive material the absolute value, at saturation, of the magnetostrictive coefficient $\lambda_s$ of which is higher than 10 ppm (parts per million) and preferably higher than 100 or 1000 ppm. The coefficient $\lambda_s$ is defined by the following relationship: $\lambda_s=\Delta L/L$, where:

ΔL is the degree of elongation of the magnetostrictive material, for example, along its preferential axis of deformation; and L is the length of this material along this axis in the absence of exterior magnetic field.

The preferential axis of deformation is the axis along which the amplitude of the deformation of the layer made of magnetostrictive material is maximal when said layer is passed through by field lines parallel to this axis.

Here, the coefficient $\lambda_s$ is positive. For example, the magnetostrictive material is Terfenol-D or FeSiB or an FeCo alloy or a derivative compound.

Here, the layer 40 is formed from a single block of material. This layer 40 has the shape of a horizontal disk. This disk is centered on the axis 9 and has horizontal planar faces on each side, which faces are, in the following, referred to as the "top" and "bottom" faces, respectively. In FIGS. 2A and 2B, the direction of the field lines generated by the magnet 12 in the interior of the layer 40 are represented by arrows. The field lines in the interior of the layer 40 extend parallel to the X direction.

The layer 40 has four distinct zones 36 to 39 (FIG. 2B) of deformation. In the position shown in FIG. 2B, in the interior of the zones 36 and 38, the layer 40 lengthens along an axis 52 parallel to the X direction much more than it shrinks in the Y direction. Simultaneously, in the interior of the zones 37 and 39, the layer 40 shrinks along an axis 53 parallel to the Y direction much more than it lengthens in the X direction. By "much more" what is meant is the fact that the amplitude of the deformation in one direction is at least two or five or ten times larger than the amplitude of the deformation in the orthogonal direction. These axes 52, 53 intersect at a point located on the axis 9 of the shaft 8. The shape of the zones 36 to 39 especially depends on the shape of the layer 40. In FIG. 2B, they are separated from one another by dashed lines. For example, along these dashed lines, the length of the layer 40 is the same as in the absence of magnetic field. In the case described here, in which the layer 40 has a disk shape, each zone 36 to 39 is a respective angular sector of the disk the apex angle of which is located on the axis 9. The value of the apex angle is equal to 90°. More precisely, in the position shown in FIG. 2B, the axis 52 forms the bisector of the zones 36 and 38 and the axis 53 forms the bisector of the two other zones 37 and 39.

In this embodiment, the converter 20 also includes for each zone of deformation and on each face of the layer 40, an electromechanical transducer. Here, the converter 20 includes:

four electromechanical transducers 42 to 45 (FIG. 3) fixed with no degree of freedom to the top face of the layer 40; and four electromechanical transducers fixed with no degree of freedom to the bottom face of the layer 40.

In FIG. 2A, only the top transducers 42 and 44 and two bottom transducers 48 and 50 may be seen. The "bottom" transducers, i.e. the transducers fixed to the bottom face of the layer 40, are symmetric with the "top" transducers, i.e. the transducers 42 to 45, relative to a median horizontal plane cutting the layer 40 in half heightwise. Therefore, in the following, the bottom transducers are not described in detail.

The transducers 42 to 45 are arranged relative to one another so that there exists at least one angular position of the converter 20, relative to the magnet 12, in which the transducers 42 to 45 are placed solely above the zones 36 to 39, respectively. One example of such a particular angular position is shown in FIG. 3. To this end, in the position shown in FIG. 3, the transducers 42 and 44 are fixed one after the other along the axis 52 and on either side of the axis 53. The transducers 43 and 45 are arranged one after the other along the axis 53 and on either side of the axis 52. The vertical plane passing through the axis 52 forms a plane of symmetry for all the top transducers. Likewise, the vertical plane passing through the axis 53 forms a plane of symmetry for all the top transducers.

In this embodiment, the transducers 42 to 45 are structurally identical and differ from one another solely by their position along the axes 52 and 53. Thus, in the following, only the transducer 42 will now be described in more detail.

The transducer 42 includes:

a layer 54 made of piezoelectric material;

an exterior electrode 56; and an interior electrode.

The layer 54 includes a horizontal interior face fixed directly with no degree of freedom to the top face of the layer 40 and a horizontal exterior face located on the opposite side. The thickness of this layer 54 measured along the Z direction is in the following denoted "e".

For example, the coupling coefficient k of the piezoelectric material of the layer 54 is higher than 5% or 10%. This coupling coefficient is defined in the ANSI/IEEE standard 176-1987 "ANSI/IEEE standard on piezoelectricity" or in the standards of the family EN50324. Preferably, the $g_{31}$ coefficient of this piezoelectric material is higher than $5\times10^{-3}$ Vm/N or $10\times10^{-3}$ Vm/N and, advantageously, higher than $100\times10^{-3}$ Vm/N or $200\times10^{-3}$ Vm/N at 25° C. For example, the piezoelectric material of the layer 54 is PZT (lead zirconate titanate) or PMN-PT (lead magnesium niobate-lead titanate).

Here, during its manufacture, each piezoelectric material is polarized by a strong electric field so as to have a polarization perpendicular to its interior and exterior faces. Here the polarization directions of the piezoelectric layers of the transducers 42 and 44 are identical. In contrast, the polarization directions of the layers made of piezoelectric material of the transducers 43 and 45 are parallel but of opposite sign to that of the layer 54.

The layer 54 is mechanically separated from the layers made of piezoelectric material of the other immediately adjacent transducers 43 to 45 by partitions 58 and 60, respectively (FIG. 3).

The partitions 58 and 60 are shaped so that the layer 54 extends essentially over the zone 36 of the layer 40 in the position shown in FIG. 3. In the case described here, the layer 54 extends solely over the zone 36. Under these conditions, in the position shown in FIG. 3, the layer 40 mainly exerts a tensile stress on the transducer 42. Here, the partition 58 extends rectilinearly along a horizontal axis 62 intersecting the axis 9 and inclined by 45° to the axis 52. The partition 60 is symmetric with the partition 58 relative to the vertical plane passing through the axis 52. This partition 60 is therefore not described in more detail.

The partition 58 is devoid of piezoelectric material. For example, it is formed by a trench filled with an electrically insulating material. Here, a material is considered to be electrically insulating if its resistivity is higher than $10^2$ Ω·m and, preferably, higher than $10^5$ Ω·m or $10^{15}$ Ω·m at 25° C.

Here, the width of the partition 58 measured along a horizontal direction orthogonal to the axis 62 is constant. For example, this width is smaller than 2e and advantageously smaller than e or than e/2 or than e/10.

Thus, in this embodiment, the layer 54 occupies more than 80% or 90% of the area of the zone 36 of the layer 40 located underneath in the position shown in FIG. 3.

Partitions 61, 63 delimit the layer made of piezoelectric material of the transducer 44. These partitions 61, 63 are, respectively, symmetric with the partitions 58, 60 relative to the vertical plane passing through the axis 53. These partitions 61, 63 are shaped so that the layer made of piezoelectric material of the transducer 44 extends solely over the zone 38 in the position shown in FIG. 3. The partitions 58, 61 thus delimit the piezoelectric material of the transducer 43 and the partitions 60, 63 thus delimit the piezoelectric material of the transducer 45. Thus, the piezoelectric material of the transducers 43, 45 extends solely over the zones 37 and 39, respectively, in the position shown in FIG. 3.

The electrode 56 is made from an electrically conductive material. Here, a material is considered to be electrically conductive if its resistivity at 25° C. is lower than $10^{-5}$ Ω·m and advantageously lower than $10^{-6}$ Ω·m or $10^{-7}$ Ω·m.

The electrode 56 is deposited directly on the exterior face of the layer 54. Typically, it covers most of this exterior face and, preferably, more than 70% or 80% of this exterior face.

In this embodiment, the electrode 56 is common to all the transducers 42 to 45. It therefore also covers more than 70% or 80% of the exterior faces of the layers made of piezoelectric material of the transducers 43 to 45 in order to also form the electrodes of these transducers. For example, the electrode 56 is made from a one-piece layer made of an electrically conductive material that covers most of the exterior faces of the transducers 42 to 45. In FIG. 3, the electrode 56 has not been shown above the partitions 58, 60, 61, 63 in order to allow these partitions to be better seen.

In the particular case described here, the layer 40 is also electrically conductive. Under these conditions, the layer 40 also plays the role of interior electrode for each of the transducers 42 to 45.

The layer 54 is used in an operating mode in which the excess of electrical charges is created between the horizontal interior and exterior faces of this layer. Specifically, when the converter 20 is used to generate electricity, it is preferable to maximize the capacitance of each of the transducers 42 to 45. Therefore here the $d_{31}$ mode of the layer 54 and not its $d_{33}$ mode is used.

During operation of the converter 20, since the magnet 12 is uniaxial, in the first position shown in FIG. 3, the lengthening of the layer 40 is maximal along the axis 52 and, simultaneously, the shrinkage of this layer 40 is maximal along the axis 53. In this first position, the zones 36 and 38 mainly exert a tensile stress in the X direction on the transducers 42 and 44 and the zones 37, 39 mainly exert a compressive stress on the transducers 43 and 45. Therefore, because of the inversion of the sign of the polarization of the layers made of piezoelectric material of the transducers 42, 44 relative to that of the transducers 43 and 45, in the first position, the layers made of piezoelectric material of the transducers 42 to 45 all generate charges of the same sign on the electrode 56. In this first position a maximum in the potential difference between the terminals 22 and 24 is obtained. When the converter 20 turns by 90° relative to the position shown in FIG. 3, the transducers 42 and 44 are entirely located above the zones 37 and 39 and the transducers 43 and 45 are entirely located above the zones 36 and 38. In this second position, the transducers 42 to 45 simultaneously generate a maximum of electrical charges of the same but opposite sign to that corresponding to the position shown in FIG. 3. Thus a minimum in the potential difference between the terminals 22 and 24 is obtained.

The structure of the converter 20 therefore makes it possible to simultaneously exploit the zones of the layer 40 exerting a tensile stress and the zones of the layer 40 exerting a compressive stress in order to increase the generated excess of electrical charges. This makes it possible to increase the efficacy of the converter 20 by at least 20% or 30% relative to a converter which is identical but in which the layers made of piezoelectric material of the transducers 42 to 45 all have the same polarization sign.

It will also be noted that since the converter 20 turns relative to the permanent magnet 12, each transducer generates, in alternation, an excess of positive charge then an excess of negative charge as the converter 20 rotates relative to the magnet 12.

Figures 4, 5:
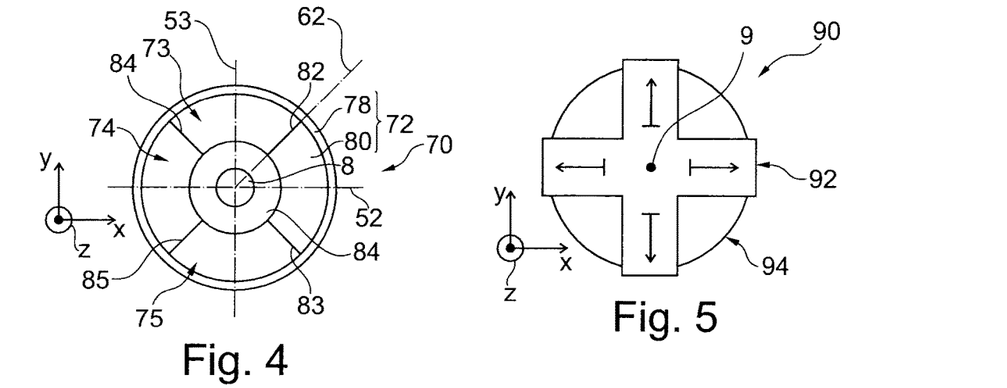
FIG. 4 is a schematic illustration of a top view of another embodiment of the converter in FIG. 3.
FIG. 5 is a schematic illustration of another embodiment of a generator of electricity using a plurality of permanent magnets.

FIG. 4 shows a converter 70 capable of being used in place of the converter 20 in the energy harvester 6.

This converter 70 is identical to the converter 20 except that the transducers 42 to 45 are replaced by transducers 72 to 75, respectively.

As in the preceding embodiment, the bottom transducers may be deduced from the top transducers 72 to 75 by symmetry relative to a median horizontal plane located halfway up the layer 40.

In this embodiment, the transducers 72 to 75 are placed relative to one another so that there exists at least one angular position of this converter relative to the magnet 12 in which the transducers 72 to 75 are placed solely over the zones 36 to 39 of the layer 40, respectively. One example of such a position is shown in FIG. 4. To this end, the two vertical planes passing through the axes 52 and 54 form planes of symmetry for all these transducers 72 to 75. Since the transducers 72 to 75 are structurally identical, only the transducer 72 will now be described in more detail.

The transducer 72 includes a layer 78 made of piezoelectric material identical to the layer 54 except that it extends uniformly right over the top face of the layer 40. Therefore, the layer 78 also forms the layer made of piezoelectric material of the transducers 73 to 75. Thus, in this embodiment, the layers made of piezoelectric material of the various transducers 72 to 75 are not mechanically insulated from one another by partitions. In addition, in this embodiment, the signs of the polarizations of the layers made of piezoelectric material of the transducers 72 to 75 are all identical.

The transducer 72 also includes an exterior electrode 80 deposited directly on the exterior face of the layer 78. This electrode 80 is identical to the electrode 56 except that it is mechanically separated from the electrodes of the other transducers 73 to 75 by separations 82 to 85. These separations 82 to 85 are devoid of electrically conductive material. Thus, these separations electrically insulate the electrode 80 from the electrodes of the other transducers 73 to 75. For example, these separations 82 and 83 are formed by trenches filled with an electrically insulating material in gaseous form, such as air, or in solid form.

The separations 82 and 83 are shaped so that the electrode 80 extends solely above the zone 36 of the layer 40 in the position shown in FIG. 4. To this end, the separation 82 extends along the axis 62 and the separation 83 is symmetric with the separation 82 relative to a vertical plane passing through the axis 52.

As above, preferably, the width of the separation 82 measured in a direction perpendicular to the axis 62 is smaller than 2e and, preferably, smaller than e or than e/2 or than e/10.

The separations 84, 85 are symmetric with the separations 82, 83 relative to the vertical plane passing through the axis 53. In this way, in the position shown in FIG. 4, the transducers 73 and 75 are solely subjected to a compressive stress when the transducers 72, 74 are solely subjected to a tensile stress and vice versa.

The layer 40 forms an interior electrode common to the transducers 72 to 75.

In this embodiment, given that the polarization direction is the same for each transducer 72 to 75, when the layer 40 lengthens along the axis 52, a tensile stress is exerted on those sections of the layer 78 that are located over the zones 36 and 38 and, simultaneously, a compressive stress is exerted on those sections of the layer 78 that are located over the zones 37 and 39. Thus, an excess of electrical charges, for example positive charges, appears on the exterior electrodes of the transducers 72 and 74 and, simultaneously, an excess of negative electrical charges appears on the exterior electrodes of the transducers 73 and 75. However, this production of negative charges does not decrease the production of positive charges because the exterior electrodes of the transducers 72 and 74 are electrically insulated from the exterior electrodes of the transducers 73 and 75. On the contrary, this excess of positive charges on one side, and negative charges on the other side, is here exploited by electrically and permanently connecting the exterior electrodes of the transducers 72 and 74 solely to the terminal 22 and the exterior electrodes of the transducers 73 and 75 solely to the terminal 24. This makes it possible to obtain, in the position shown in FIG. 4, a larger potential difference than if the exterior electrodes of the transducers 72 to 75 were replaced by a single common exterior electrode. This therefore makes it possible to increase the efficacy of the converter 70.

FIG. 5 shows a generator 90 of electricity. This generator 90 is identical to the generator 2 except that:
the permanent magnet 12 is replaced by an assembly 92 of permanent magnets; and
the converter 20 is replaced by a converter 94.

In FIG. 5, for the sake of simplicity, only those elements of the generator 90 that are different from those of the generator 2 have been shown.

The assembly 92 has four horizontal magnetic moments uniformly distributed about the axis 9. In FIG. 5, two of these magnetic moments are aligned with the X direction and of opposite sign. The two other magnetic moments are aligned with the Y direction and of opposite sign. For example, the assembly 92 is obtained by assembling four uniaxial permanent magnets.

The converter 94 is identical to the converter 20 except that in the layer 40 there is a larger number of zones of deformation able to exert mainly either a tensile stress or a compressive stress. There is therefore a larger number of electromechanical transducers on each of the faces of this layer 40. These zones of deformation and the location of the transducers on the top face of the layer 40 will now be described with reference to FIG. 6.

Figure 6:
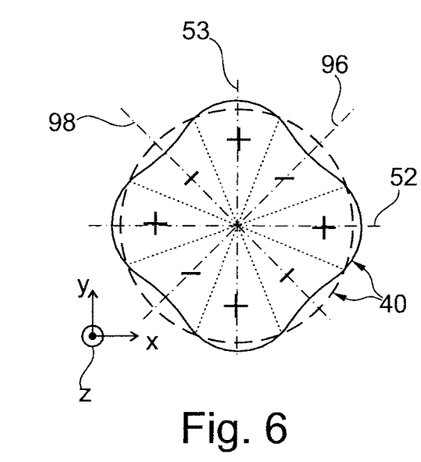
FIG. 6 is a schematic illustration of a top view of the zones of deformation of a layer made of magnetostrictive material, which layer is used in the generator in FIG. 5.

The periphery of the layer 40, as seen from above, in the absence of the magnetic field generated by the assembly 92, is shown by the dashed line in FIG. 6. Here, it is the shape of a circle centered on the axis 9.

The layer 40, in the presence of the magnetic field generated by the assembly 92 when it is in the position shown in FIG. 5, is shown by the solid line in FIG. 6. In this figure, the deformation of the layer 40 has been exaggerated. It may in fact be smaller than 100 µm or 10 µm.

In the configuration shown in FIG. 6, the layer 40 lengthens simultaneously along the axes 52 and 53 and, at the same time, shrinks along the horizontal axes 96 and 98. These axes 96 and 98 are orthogonal to each other and shifted angularly by 45° relative to the axes 52 and 53. There are therefore eight distinct zones of deformation in this embodiment. In the position shown in FIG. 5, the zones that mainly exert a tensile stress on the electromechanical transducers are located along the axes 52 and 53 and the zones that exert mainly a compressive stress are located along the axes 96 and 98. In FIG. 6, the eight zones of deformation are delimited by dashed lines. In addition, the zones that exert a tensile stress are identified by the "+" symbol and those that exert a compressive stress are identified by a "−" symbol.

On each of the zones of deformation is formed a transducer according to the teaching given with reference to FIGS. 2A, 2B and 3 or according to the teaching given with reference to FIG. 4.

In the case where the teaching of FIGS. 2A, 2B and 3 is applied, the partitions between the piezoelectric layers of the various top transducers are formed, typically, along the dotted lines delimiting the various zones of deformation of the layer 40. In the case where the teaching given with reference to FIG. 4 is applied, the separations between the exterior electrodes of the various transducers are formed, typically, along the dotted lines delimiting these various zones of deformation.

As the converter 94 rotates, each electromechanical transducer undergoes in alternation mainly a tensile stress then mainly a compressive stress.

Figure 7:
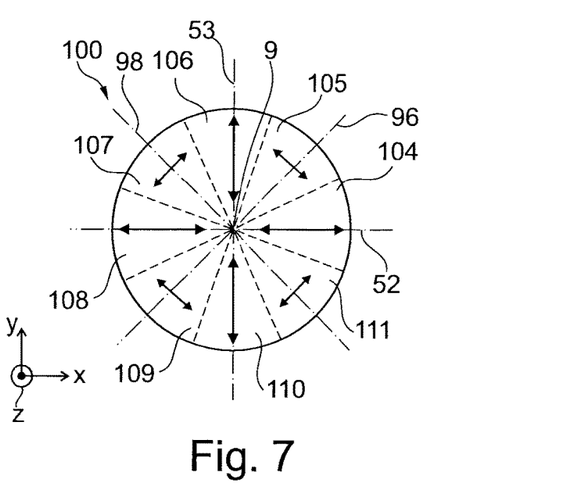
FIG. 7 is a schematic illustration of a top view of an assembly of permanent magnets for the generator of electricity in FIG. 5.

FIG. 7 shows an assembly 100 of permanent magnets capable of being used in place of the assembly 92 in the generator 90. This assembly 100 is the shape of a horizontal disk centered on the axis 9. This disk is divided into eight successive magnetized angular sectors 104 to 111 in the counterclockwise direction. The apex angle of each angular sector is located on the axis 9. These sectors 104 to 111 are uniformly distributed about the axis 9. They each have an apex angle of 60° located on the axis 9. In the position shown in FIG. 7, the vertical planes passing through the axes 52, 53, 96 and 98 are planes of symmetry of the assembly 100. Each magnetized sector 104 to 111 comprises at least one uniaxial permanent magnet. In FIG. 7, the magnetic moments are represented by double arrows. Specifically, in this application, the sign of the magnetic moment is of little importance because a magnetostrictive material is sensitive solely to the direction of the magnetic field but not to its sign. In the angular position shown in FIG. 7, the magnetic moments of the permanent magnets of sectors 104 and 108 are parallel to the axis 52. Similarly, the magnetic moments of the permanent magnets of sectors 106 and 110 are parallel to the axis 53. The magnetic moments of the permanent magnets of sectors 105 and 109 are perpendicular to the axis 96. Lastly, the magnetic moments of the permanent magnets of sectors 107 and 111 are perpendicular to the axis 98. A generator equipped with the assembly 100 operates as the generator 90 except that the presence of magnets the magnetic moment of which is perpendicular to the axes 96, 98 increases the contractive stress exerted on the electromechanical transducers located above the zones of the layer 40 identified by the "−" symbol in FIG. 6. This makes it possible to further increase the efficacy of the converter.

Figure 8:
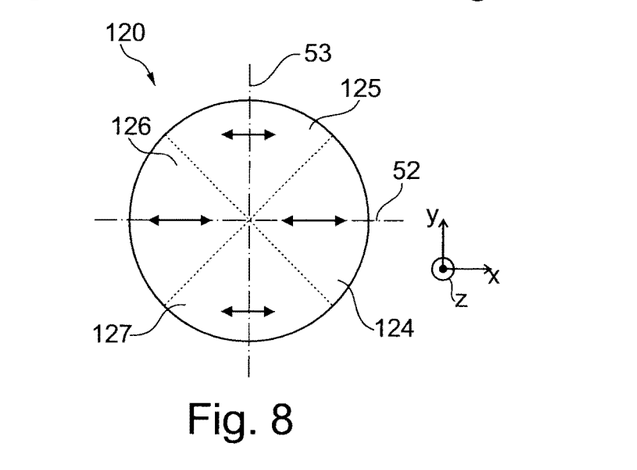
FIG. 8 is a schematic illustration of a top view of an assembly of permanent magnets for the generator in FIG. 1.

FIG. 8 shows an assembly 120 of permanent magnets, which assembly is identical to the assembly 100 except that it has only four magnetized angular sectors 124 to 127 uniformly distributed about the axis 9. In the position shown, the magnetic moments of the sectors 124 and 126 are parallel to the axis 52 and the magnetic moments of the sectors 125 and 127 are perpendicular to the axis 53. This assembly 120 functions as the assembly 100 but is intended to replace the magnet 12 of the generator 2 of electricity. Thus, in the position shown in this figure, the presence of the magnets 125 and 127 above the zones 37 and 39 allows the compressive stress exerted by the layer 40 on the transducers 43 and 45 to be increased. Specifically, as in the preceding embodiment, the field lines generated by the magnets 125 and 127 tend to shrink the layer 40 along the axis 53 in the zones 37 and 39.

Figure 9:
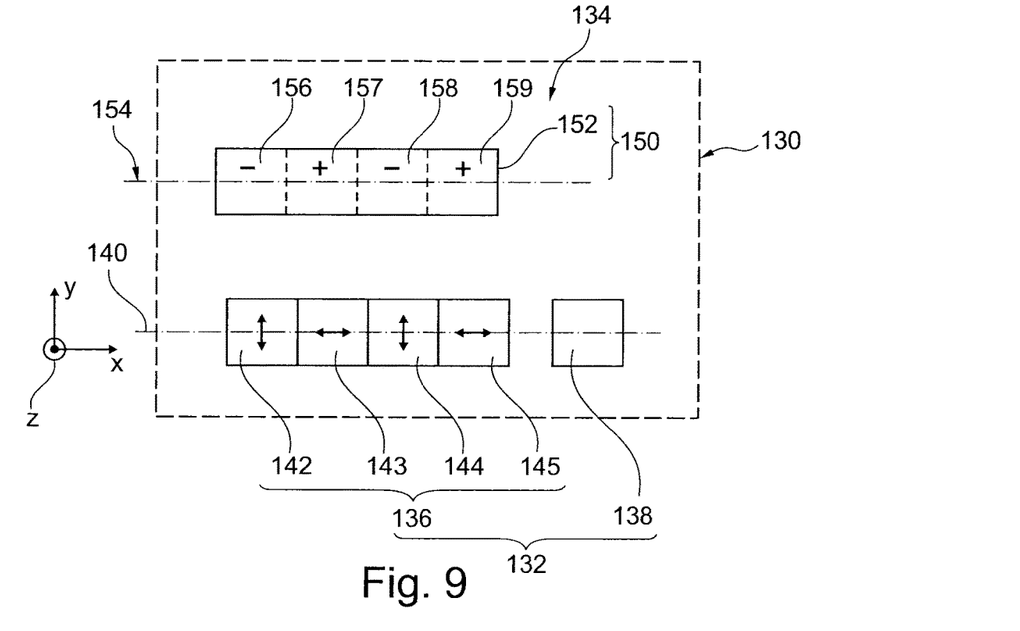
FIG. 9 is a schematic illustration of another embodiment of a generator of electricity using a translationally movable magnetic field.

FIG. 9 shows a generator 130 of electricity. This generator 130 includes:
a variable magnetic field source 132; and
an energy harvester 134.

The source 132 comprises an assembly 136 of permanent magnets fixed to one another with no degree of freedom and a device 138 that moves the assembly 136 translationally parallel to the X direction. Here, the device 138 moves the assembly 136 with a reciprocal movement back and forth along a horizontal axis 140. Thus, in this embodiment, the variable magnetic field is not a rotating magnetic field.

The assembly 136 comprises a succession of uniaxial permanent magnets that are aligned one after another along the axis 140. In this example, only four uniaxial permanent magnets are shown, numbered 142 to 145 from left to right. Each of these permanent magnets has a magnetic moment represented by a double arrow in FIG. 9. These permanent magnets are arranged relative to one another so that, from left to right along the axis 140, the directions of the magnetic moments alternate between directions parallel to the X and Y directions. Thus, in FIG. 9, the magnetic moment of the magnets 142 and 144 is parallel to the Y direction whereas the magnetic moment of the magnets 143 and 145 is parallel to the X direction. Here, the width of the magnets 142 to 145 along the axis 140 is the same whatever the magnet in question.

The harvester 134 is identical to the harvester 6 except that the converter 20 is replaced by a converter 150. As in the preceding embodiments, the converter 150 comprises a horizontal layer 152 made of magnetostrictive material, above and below which are fixed electromechanical transducers. To simplify FIG. 9, only the layer 152 of the converter 150 has been shown. In addition, in FIG. 9, so that the layer 152 may be seen, it has been represented to the side of the assembly 136. However, in fact, the converter 150 and the layer 152 are located in vertical alignment with the assembly 136 in the position shown in this figure.

Here, the converter 150 remains stationary in the XYZ coordinate system.

The layer 152 extends mainly along a horizontal axis 154 parallel to the axis 140. For example, the layer 152 is rectangular. It is located directly opposite the assembly 136 of permanent magnets so that the magnetic field lines of each of these permanent magnets passes therethrough essentially horizontally. Under these conditions, each magnet 142 to 145 creates a respective zone of deformation in the layer 152 directly opposite. The zones of deformation created by the magnets 142 to 145 are numbered 156 to 159, respectively. In the position shown in FIG. 9, the zones 156 and 158 tend to lengthen in the Y direction under the effect of the magnetic field of the magnets 142 and 144. The lengthening in the Y direction corresponds to a shrinkage in the X direction and therefore to a compressive stress, along the axis 154, exerted on the electromechanical transducer located in this zone. This compressive stress is represented by the "−" symbol in FIG. 9. At the same time, the zones 157 and 159 tend to lengthen in the X direction under the effect of the magnetic field of the magnets 143 and 145. The zones 157 and 159 therefore exert a tensile stress, along the axis 154, on the electromechanical transducers located in these zones. This tensile stress is represented by the "+" symbol. To simplify FIG. 9, the separations between the zones are represented by dashed lines parallel to the Y direction. However, in fact, the shape of these lines may be more complex.

Distinct electromechanical transducers are fixed with no degree of freedom to each of the zones 156 to 159 in order to convert both the simultaneous lengthening and shrinkage of the layer 152 in the X direction into a generation of excess of electrical charges. These electromechanical transducers are produced as described in the preceding embodiments and are not described in more detail here.

When the assembly 136 is moved by a step equal to the width of the magnets 142 to 145 to the right or to the left, along the axis 140, the mechanical stresses exerted on the electromechanical transducers placed over the zones 156 to 159 change sign. Thus, after a movement of one step, the electromechanical transducers that mainly underwent a tensile stress mainly undergo a compressive stress and vice versa. The operating mode of the generator 130 may therefore be deduced from that described in the case of the assembly 100 of permanent magnets.

Figure 10:
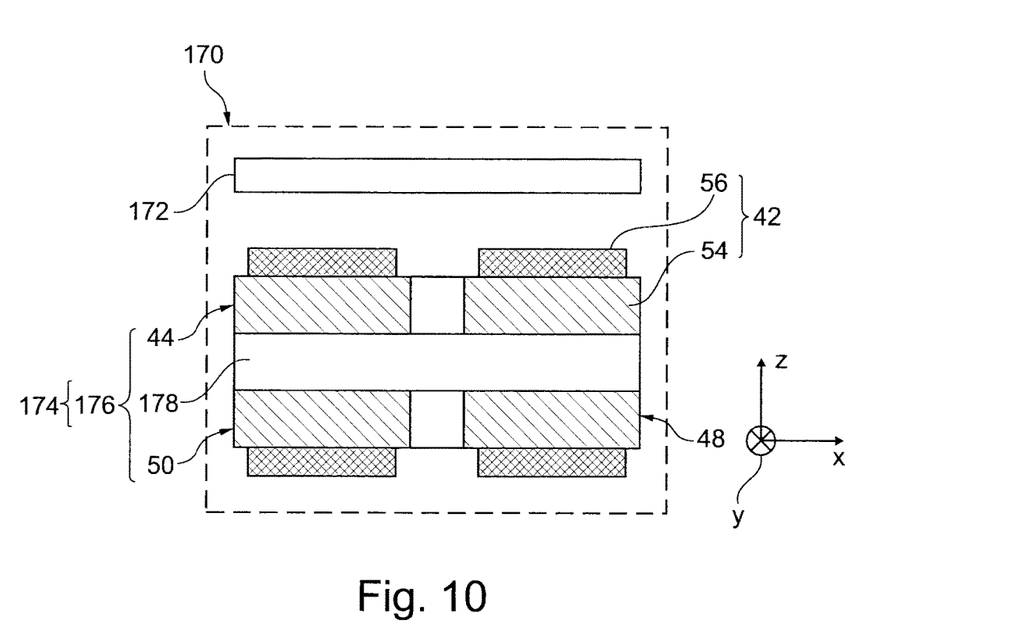
FIG. 10 is a schematic illustration of another embodiment of a generator of electricity using a temperature variation.

FIG. 10 shows a generator 170 of electricity. The generator 170 is identical to the generator 2 except that:
the source 4 of energy to be harvested is replaced by a source 172 of energy to be harvested; and
the energy harvester 6 is replaced by an energy harvester 174.

The source 172 is here a heat source the temperature of which varies over time. This heat source heats substantially uniformly all of the converter of the harvester 174.

The harvester 174 is identical to the harvester 6 except that the converter 20 is replaced by a converter 176. The converter 176 is identical to the converter 20 except that the layer 40 is replaced by a layer 178 made of shape-memory material. To simplify FIG. 10, only the converter 176 has been shown. Here, it is a question of a shape-memory material that lengthens, along its preferential axis of deformation, by at least more than 0.5% or 1% in response to a temperature variation of 10° or 20° C. The preferential axis of deformation of the layer 178 is the axis along which the amplitude of its deformation is maximal. This layer 178 is then configured so that in response to an increase in the exterior temperature, it contracts along an axis such as the axis 52 and, simultaneously, lengthens along another axis such as the axis 53. To achieve this, for example, the preferential axis of deformation of the layer 178 is aligned with the axis 52 in the first position. For more information on the shape-memory materials usable in such a converter, the reader may refer to articles A2 and A3.

The operating mode of the generator 170 may be deduced from that of the generator 2.

Figure 11:
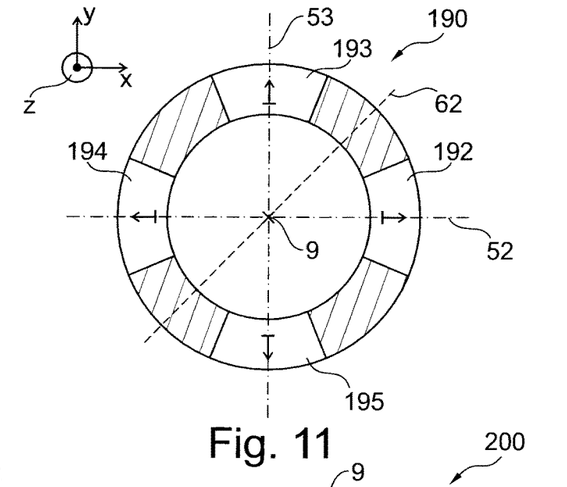
FIG. 11 is a schematic illustration of a top view of another embodiment of an assembly of permanent magnets for the generator in FIG. 5.

FIG. 11 shows an assembly 190 of permanent magnets, which assembly is usable in place of the assembly 92 in FIG. 5. In this embodiment, the assembly 190 is the shape of a horizontal ring centered on the axis 9. The assembly 190 includes four permanent magnets 192 to 195 uniformly distributed about the axis 9. Each magnet 192 to 195 occupies a respective angular sector of the ring. The angular sectors occupied by the magnets 192 to 195 are the same as the sectors occupied by the magnets 104, 106, 108 and 110 in FIG. 7. The angular sectors between these magnets 192 to 195 are for example devoid of permanent magnets. These angular sectors devoid of permanent magnets are hatched in FIG. 11. Preferably, when the assembly 190 is used, the layer 40 is also in the shape of a ring with the same inside and outside diameters as the assembly 190.

Figure 12:
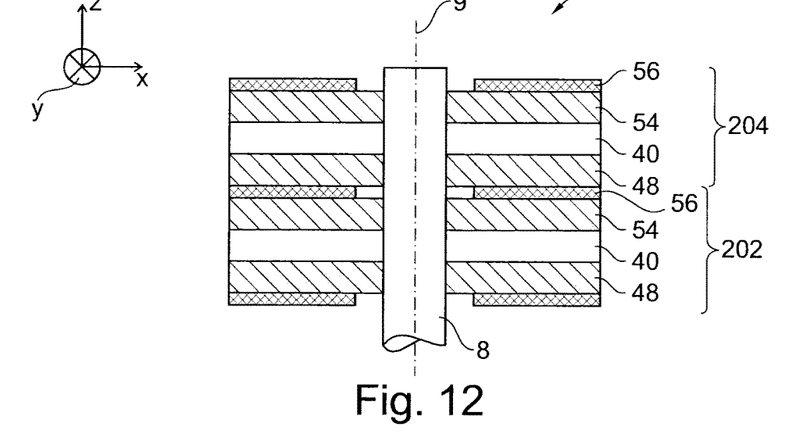
FIGS. 12 and 13 are schematic illustrations, in vertical cross section, of other embodiments of the converter in FIG. 2A.

FIG. 12 shows a converter 200 capable of being used in place of the converter 20. The converter 200 results from the assembly, on top of one another, in the vertical direction, of a plurality of specimens of the converter 20. To simplify FIG. 12, only two specimens 202 and 204 are shown. More precisely, these specimens are stacked on top of one another so that the transducers 42 of each specimen are located on top of one another in the vertical direction. Under these conditions, each transducer 42 is fixed above and below a respective zone 39 in the position shown in FIG. 2B. Preferably, the exterior electrode 56 of the specimen 202 also plays the role of the electrode for the layer 48 of the specimen 204.

During use of the converter 200, all the electrodes 56 and their symmetric (relative to a median plane of the layer 40) equivalents generate at the same time electrical charges of the same sign. Thus, preferably, all these electrodes are electrically connected directly to the same terminal 22. Likewise, all of the layers 40 are electrically connected directly to the terminal 24. The converter 200 then has a better efficacy relative to the converter 20.

Figure 13:
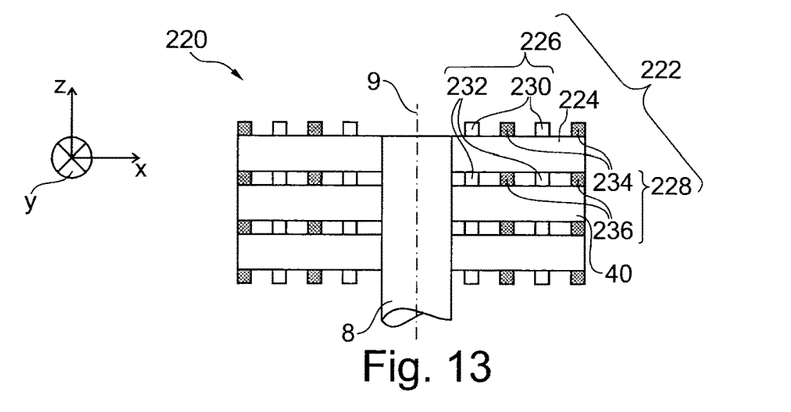

Up to now, only the $d_{31}$ mode of the layers made of piezoelectric material has been used. FIG. 13 shows a converter 220 capable of being used in place of the converter 20 but in which it is the $d_{33}$ mode of the layers made of piezoelectric material that is used. The converter 220 is identical to the converter 20 except that the electromechanical transducers are replaced by other electromechanical transducers of the same shape and arranged relative to one another as described with reference to FIGS. 2A, 2B and 3. Thus, here, only one transducer 222 replacing the transducer 42 is described in more detail.

The transducer 222 is produced as described with reference to FIG. 3 of article A1 cited above. In other words, the transducer 222 includes a layer 224 made of piezoelectric material polarized parallelly to the X direction in the position shown in FIG. 13. This layer 224 is for example formed by juxtaposing, in a horizontal plane, parallelly to one another fibers made of PZT extending in the X direction and polarized in this direction. Each electrode 226, 228 of the transducer 222 is formed from one or more combs. Each comb is composed of a plurality of fingers made of electrically conductive material, each of which extends parallelly to the Y direction over one face of the layer 224. Each comb of the electrode 226 is interlaced or "interdigitated" with a corresponding comb of the electrode 228 in order to form what is known as an interdigitated comb configuration. Here, the electrode 226 includes two combs 230, 232 placed on the exterior and interior faces of the layer 224, respectively. Likewise, the electrode 228 includes two combs 234, 236 placed on the exterior and interior faces of the layer 224, respectively. The comb 230 is interlaced with the comb 234 and the comb 232 is interlaced with the comb 236.

The other transducers placed over the zones 37 to 39 may be deduced from the transducer 222 by a rotation about the axis 9 of 90°, 180° and 270°, respectively. Thus, in this embodiment, the directions of polarization of these transducers are aligned along the axes 52 and 53 in the first position. In addition, the electrodes of the transducers aligned with the axis 52 in the first position are electrically insulated from the electrodes of the transducers aligned with the axis 53 in the same position.

The operating mode of the generator 2 equipped with the converter 220 may be deduced from what was explained above when the generator is equipped with the converter 20.

Many other embodiments are possible. For example, the electromechanical transducers are formed only on one portion of the zones of deformation of the layer 40 or 152. By way of illustration, it is possible therefore to form an electromechanical transducer solely on the half of the zones of deformation marked by the "+" symbol in FIG. 6 and on the half of the zones of deformation marked by the "−" symbol in the same FIG. 6.

Piezoelectric materials other than PZT or PMN-PT may be used to produce the electromechanical transducers. In practice, by piezoelectric material what is meant is any material capable of converting a mechanical stress into an excess of electrical charges on one of its horizontal faces. For example, the material PZT may be replaced by PVDF (polyvinylidene fluoride). Preferably, the thickness "e" of the layer 54 when made of PVDF is smaller than 300 µm and advantageously smaller than 30 µm or 40 µm. Generally, the thickness "e" is larger than 10 µm. Specifically, the choice of PVDF as piezoelectric material with a thickness smaller than 300 µm, in the arrangement described here of the converter 20, allows the efficacy of the converter to be increased. The material PZT may also be replaced by a piezoelectric foam such as one of those described in the following article:

Imran Patel, "*Ceramic-based intelligent piezoelectric energy harvesting device*", Intechopen, Sep. 6, 2011.

Some of the transducers may be fixed to the top face of the layer 40, others of the transducers being fixed to the bottom face. For example, only the transducers 72, 74 are fixed to the top face of the layer 40 and only the symmetric equivalents of the transducers 73 and 75 are fixed to the bottom face of the layer 40. This makes it possible to have on each face of the layer 40 solely electromechanical transducers that generate charges of the same sign.

In another variant, the electromechanical transducers are fixed only to a single side of the layer 40.

Preferably, the layer made of piezoelectric material extends over more than 80% or 90% of the zone of deformation in the first position. In the first position, it may also extend a little beyond this zone of deformation. However, in any case, most of the layer made of piezoelectric material is fixed to this zone of deformation in the first position.

The embodiments of FIGS. 2A and 4 may be combined. In this case, partitions mechanically insulate the piezoelectric layers and separations mechanically insulate the electrodes of each transducer. In the latter case, the piezoelectric layers of the transducers 43 and 45 may be polarized in the same direction as the layers made of piezoelectric material of the transducers 42 and 44. In the latter embodiment, the electrical connection to the terminals 22 and 24 is achieved as described for the embodiment in FIG. 4.

In the embodiment in FIGS. 1 to 3, the partitions 58, 60, 61 and 63 may be omitted. Specifically it is possible to polarize various sectors of a given layer made of piezoelectric material in opposite directions without however needing to use partitions electrically and mechanically separating these sectors.

The electrodes of transducers that systematically and simultaneously generate electrical charges of the same sign do not need to be mechanically insulated from one another by separations. For example, the electrode 80 may also extend above the layer made of piezoelectric material of the transducer 74 in order to form in addition the electrode of the latter transducer. This does not cause problems because the transducers 72 and 74 are aligned along the same axis of deformation and have the same polarization direction so that they generate charges of the same sign in response to given deformations of the layer 40.

As a variant, an interior electrode made of electrically conductive material is interposed between the layers 40 and 54. This proves to be necessary in any embodiment in which the layer 40 or 178 is produced from a material that is not electrically conductive.

The exterior electrodes are not necessarily fixed directly to the layer made of piezoelectric material. For example, they may be separated from this layer by a thin intermediate layer. Typically, the thickness of this thin intermediate layer is smaller than ¹⁄₁₀₀ or than ¹⁄₁₀₀₀ of the thickness of the piezoelectric layer. They may also be able to move slightly relative to the layer made of piezoelectric material.

As a variant, all the electrodes are placed on the same face of the layer made of piezoelectric material. For example, the combs 232, 236 are omitted and, alternatively, the combs 230, 234 are omitted. Also as a variant, it is possible to preserve only the combs 232 and 234 for example.

The layer 40 or 178 is not necessarily formed from a single block of material. As a variant, the layer 40 or 178 is formed by juxtaposing small blocks of magnetostrictive or shape-memory material assembled with no degree of freedom to one another to form a layer that behaves mechanically as the layer made of a single block of material.

The magnetostrictive material may also be replaced by a magnetic shape-memory alloy such as NiMnGa, i.e. a material that works as described for the preceding shape-memory materials except that the deformation is triggered by a variation in magnetic field and not by a temperature variation.

The shape of the transducer capable of converting the variation in the energy to be harvested into a variation in mechanical stress may be different from a disk. For example, in another advantageous embodiment, the layer 40 has the shape of an ellipse or a ring. In other variants, the layer 40 may be a square, a rectangle or a polygon having more than four corners.

The converter 20 may be mounted at the end of the shaft without it being transpierced at its center by the shaft 8.

The rotation of the magnetic field relative to the converter may also be obtained by making the assembly of magnets turn in the XYZ coordinate system rather than the converter. This may simplify connection.

What was described for the case of a rotary movement of the converter relative to a permanent magnet also applies to the case where the variable magnetic field is generated by the translation of a permanent magnet. The variable magnetic field may also be generated by a coil through which a current of variable magnitude flows.

Other directions of the magnetic moments of the assemblies of permanent magnets are possible. For example, in the assembly 136 the direction of the magnetic moments of the magnets 142 and 144 may be inclined, in the horizontal plane, by +45° to the axis 140 whereas the direction of the magnetic moments of the magnets 143 and 145 may be inclined by −45°, in the horizontal plane, to the same axis 140.

The assembly of permanent magnets may include many more permanent magnets than were shown. For example, this number of permanent magnets may be higher than ten or forty, especially in the embodiments in FIGS. 9 and 11.

Depending on the nature of the energy to be harvested, transducers other than a layer made of magnetostrictive material may be used. For example, if the energy to be harvested is a temperature variation, the layer made of magnetostrictive material is replaced by a layer made of shape-memory material. In this case, in order to make the temperature of the layer made of shape-memory material vary, it is not necessary for the heat source to move. It may be stationary relative to the layer made of shape-memory material and only its temperature varies. In the case where the layer 152 made of magnetostrictive material is replaced by a layer made of shape-memory material the preferential axis of deformation of which is coincident with the axis 154, to obtain the same harvester operating mode, the assembly 136 of permanent magnets is replaced by an anisotropic heat source. The anisotropic heat source is for example obtained by replacing each magnet of the assembly 136 with a thin tube or filament aligned with the magnetic moment of the magnet that it replaces. Thus, in the position shown in FIG. 9, the tube or the filament facing the zone 156 is perpendicular to the axis 154 so that this zone lengthens little in the X direction. In contrast, the tube or filament facing the zone 157 is parallel to the axis 154 so that this zone lengthens much more in the X direction.

The apparatus 10 may be a mechanical bearing. In this case, the axis 8 is the axis of this bearing and the mounting 14 is the mounting of the bearing.

The invention claimed is:

1. A converter of a variation in energy to be harvested into a potential difference, the converter comprising:
   a first transducer including a layer extending substantially in a plane, as a reference plane, and behaving mechanically as a single block of material, the layer being configured, while remaining in said reference plane, to lengthen in an interior of at least one first zone of deformation of the reference plane and, simultaneously, to shrink in an interior of at least one second zone of deformation of the reference plane in response to a given variation in energy to be harvested, the second zone being distinct from the first zone; and
   electromechanical second and third transducers, each electromechanical transducer including:
      a layer made of piezoelectric material extending substantially parallel to the reference plane and having exterior and interior faces extending parallel to the reference plane, an interior face being fixed with no degree of freedom to the layer of the first transducer to undergo a mechanical stress exerted by one of the zones of this layer; and
      first and second electrodes made of electrically conductive material extending substantially parallel to the reference plane along at least one of the faces of the layer made of piezoelectric material to cause an excess of electrical charges to appear on one of the first and second electrodes in response to the mechanical stress undergone by the layer made of piezoelectric material,
   wherein the interior faces of the electromechanical second and third transducers are fixed with no degree of freedom substantially to the first and second zones of deformation of the layer of the first transducer, respectively, and the third transducer differs from the second transducer by a polarization of its layer made of piezoelectric material in a direction different from the polarization of the layer made of piezoelectric material of the second transducer and/or by existence of a separation mechanically and electrically insulating its first electrode from the first electrode of the second transducer, which electrode is located on a same side of the layer made of piezoelectric material.

2. The converter as claimed in claim 1, wherein:
the interior faces of the second and third transducers are fixed with no degree of freedom to a same face of the layer of the first transducer parallel to the reference plane;
the polarizations of the layers made of piezoelectric material of the second and third transducers have opposite signs to each other so that the second and third transducers generate, at a same time, electrical charges of a same sign on their respective first electrodes in response to a given variation in the energy to be harvested; and
the first electrodes are electrically connected to each other to form a common electrode on which the electrical charges generated simultaneously both by the second and third transducers accumulate.

3. The converter as claimed in claim 2, wherein the first electrodes comprise a layer made of electrically conductive material in a single block, which layer is deposited directly on the exterior faces of the layers made of piezoelectric material of the second and third transducers and covers most of the exterior faces of the two layers made of piezoelectric material to form an electrode common to the electromechanical second and third transducers.

4. The converter as claimed in claim 2, wherein the converter includes a fourth transducer including a layer extending substantially in a plane parallel to the reference plane and behaving mechanically as a single block of material, this layer configured to lengthen in the interior of at least one first zone of deformation parallel to the reference plane and, simultaneously, to shrink in the interior of at least one second zone of deformation parallel to the reference plane in response to a given variation in energy to be harvested, the second zone being distinct from the first zone and the first and second zones of deformation of the layer of the fourth transducer being directly opposite the first and second zones of deformation of the layer of the first transducer, respectively, and the exterior faces of the layers made of piezoelectric material of the second and third transducers are fixed with no degree of freedom essentially to the first and second zones of deformation of the layer of the fourth transducer, respectively.

5. The converter as claimed in claim 1, wherein the converter includes a partition that mechanically insulates the layers made of piezoelectric material of the second and third transducers, the width of this partition over most of its length located between the second and third transducers being smaller than the thickness of the layer made of piezoelectric material of these second and third transducers.

6. The converter as claimed in claim 1, wherein the piezoelectric material is PVDF (polyvinylidene fluoride) and the thickness of the layer made of piezoelectric material is smaller than 300 μm.

7. The converter as claimed in claim 1, wherein the layer of the first transducer has opposite top and bottom faces parallel to the reference plane and specimens of the second and third transducers are distributed over each of the two opposite faces of the layer of the first transducer symmetrically relative to a plane of symmetry parallel to the reference plane and located between the two opposite faces of the first transducer.

8. The converter as claimed in claim 1, wherein:
the interior faces of the second and third transducers are fixed with no degree of freedom to a same face of the layer of the first transducer parallel to the reference plane;
the polarization directions of the layers made of piezoelectric material of the second and third transducers are parallel and of a same sign so that the second and third transducers generate at a same time electrical charges of opposite sign on their respective first electrodes in response to a given deformation of the first transducer, respectively; and
a separation mechanically and electrically insulates the first electrodes from each other to generate between these first electrodes a larger potential difference than that existing between the interior and exterior faces of the piezoelectric layers of each of these electromechanical transducers.

9. The converter as claimed in claim 1, wherein:
the interior faces of the second and third transducers are fixed with no degree of freedom to a same face of the layer of the first transducer parallel to the reference plane;
the polarizations of the layers made of piezoelectric material of the second and third transducers are parallel to the reference plane and shifted angularly one relative to the other so that the second and third transducers generate, at a same time, electrical charges of opposite sign on their respective first electrodes in response to a given variation in the energy to be harvested; and
a separation mechanically and electrically insulates the first electrodes from each other to generate between these first electrodes a potential difference.

10. The converter as claimed in claim 1, wherein the layer of the first transducer is produced from magnetostrictive material, this layer made of magnetostrictive material configured to lengthen in the interior of the first zone of deformation and, simultaneously, to shorten in the interior of the second zone of deformation in response to a given variation in a magnetic field.

11. The converter as claimed in claim 1, wherein the layer of the first transducer is produced from shape-memory material, this layer made of shape-memory material configured to lengthen in the interior of the first zone of deformation and, simultaneously, to shorten in the interior of the second zone of deformation in response to a given variation in temperature or in magnetic field.

12. A generator of electricity comprising:
a variable magnetic field source; and
a converter configured to convert a variation in the magnetic field of the magnetic field source into a potential difference, wherein:
the converter is according to claim 10; and
the magnetic field source configured to generate simultaneously, in the interior of the layer of the first transducer, the first and second zones of deformation.

13. The generator as claimed in claim 12, wherein:
the variable magnetic field source includes at least one permanent magnet; and
the converter is movable relative to this permanent magnet between:

a first position in which only one of the first and second zones of deformation directly faces the permanent magnet; and a second position in which the other of these first and second zones of deformation directly faces the permanent magnet.

14. The generator as claimed in claim 13, wherein the source includes at least one first permanent magnet having a first magnetic moment and a second permanent magnet having a second magnetic moment, the first and second permanent magnets being fixed with no degree of freedom to each other, and orthogonal projections, in the reference plane, of the magnetic moments of the first and second permanent magnets are angularly shifted relative to each other by 90° plus or minus 20°.

15. The generator as claimed in claim 13, wherein:
the layer of the first transducer has a shape of a disk or a ring centered on an axis of revolution;
each first and second zones of deformation are distinct angular sectors of this disk or this ring; and
at least one of the permanent magnet and of the first transducer is mounted to be able to rotate about the axis of revolution.

16. The converter as claimed in claim 1, wherein the variation in energy to be harvested is chosen in the group consisting of a variable magnetic field and a temperature variation.

* * * * *